(12) United States Patent
Shome et al.

(10) Patent No.: US 11,899,380 B2
(45) Date of Patent: Feb. 13, 2024

(54) APPARATUS FOR AND METHOD OF SENSING ALIGNMENT MARKS

(71) Applicant: ASML Holding N.V., Veldhoven (NL)

(72) Inventors: Krishanu Shome, Cheshire, CT (US); Igor Matheus Petronella Aarts, Port Chester, NY (US); Junwon Lee, Weston, CT (US)

(73) Assignee: ASML Holding N.V., Veldhoven (NL)

( * ) Notice: Subject to any disclaimer, the term of this patent is extended or adjusted under 35 U.S.C. 154(b) by 0 days.

(21) Appl. No.: 17/770,575

(22) PCT Filed: Sep. 28, 2020

(86) PCT No.: PCT/EP2020/077141
§ 371 (c)(1),
(2) Date: Apr. 20, 2022

(87) PCT Pub. No.: WO2021/078474
PCT Pub. Date: Apr. 29, 2021

(65) Prior Publication Data
US 2022/0291598 A1    Sep. 15, 2022

Related U.S. Application Data

(60) Provisional application No. 62/923,735, filed on Oct. 21, 2019.

(51) Int. Cl.
*G03F 7/20* (2006.01)
*G03F 9/00* (2006.01)
*G01J 9/02* (2006.01)

(52) U.S. Cl.
CPC .............. *G03F 9/7046* (2013.01); *G01J 9/02* (2013.01); *G03F 9/7049* (2013.01); *G03F 9/7088* (2013.01); *G01J 2009/028* (2013.01)

(58) Field of Classification Search
CPC .... G03F 9/7046; G03F 9/7049; G03F 9/7088; G03F 7/7085; G01J 9/02; G01J 2009/028
See application file for complete search history.

(56) References Cited

U.S. PATENT DOCUMENTS 5,194,744 A  *  3/1993  Aoki ..................... G03F 9/7049
                                                        250/548
5,446,542 A     8/1995  Muraoka
                        (Continued)

FOREIGN PATENT DOCUMENTS

CN          104020642 A       9/2014
EP          0 458 354 A2     11/1991
                        (Continued)

OTHER PUBLICATIONS

International Search Report and Written Opinion of the International Searching Authority directed to related International Patent Application No. PCT/EP2020/077141, dated Jan. 12, 2021; 12 pages.

(Continued)

*Primary Examiner* — Mesfin T Asfaw
(74) *Attorney, Agent, or Firm* — Sterne, Kessler, Goldstein & Fox P.L.L.C.

(57) ABSTRACT

An apparatus for and method of sensing alignment marks in which a self-referencing interferometer based sensor outputs standing images of the alignment marks and camera device is used to capture the images as output by the sensor and a detector is used to obtain phase information about the alignment marks from the images as output by the sensor.

18 Claims, 6 Drawing Sheets

(56) References Cited

U.S. PATENT DOCUMENTS

| | | | |
|---|---|---|---|
| 5,477,057 A * | 12/1995 | Angeley | G03F 9/7088 |
| | | | 250/548 |
| 6,016,186 A | 1/2000 | Mizutani | |
| 6,297,876 B1 | 10/2001 | Bornebroek | |
| 6,961,116 B2 | 11/2005 | Den Boef et al. | |
| 8,139,217 B2 | 3/2012 | Van Bilsen et al. | |
| 8,610,898 B2 | 12/2013 | Khuat Duy | |
| 9,885,558 B2 | 2/2018 | Inada et al. | |
| 10,690,995 B2 | 6/2020 | Kumar et al. | |
| 2003/0054574 A1 | 3/2003 | Tanaka et al. | |
| 2012/0057171 A1* | 3/2012 | Khuat Duy | G03F 9/7049 |
| | | | 356/494 |
| 2014/0320839 A1 | 10/2014 | Maeda | |
| 2015/0227061 A1* | 8/2015 | Tinnemans | G03F 9/7069 |
| | | | 356/509 |
| 2017/0082932 A1* | 3/2017 | Fu | G03F 7/70633 |
| 2018/0357758 A1 | 12/2018 | Matejka et al. | |

FOREIGN PATENT DOCUMENTS

| | | |
|---|---|---|
| EP | 1 372 040 A2 | 12/2003 |
| TW | 2004-15449 A | 8/2004 |
| TW | 2018-09921 A | 3/2018 |
| WO | WO 2016/192865 A1 | 12/2016 |
| WO | WO 2018/007118 A1 | 1/2018 |

OTHER PUBLICATIONS

Taiwanese Office Action directed to Taiwanese Patent Application No. 111149108, dated Jul. 28, 2023; 6 pages.

* cited by examiner

APPARATUS FOR AND METHOD OF SENSING ALIGNMENT MARKS

CROSS-REFERENCE TO RELATED APPLICATIONS

This application claims priority of U.S. Provisional Patent Application No. 62/923,735, which was filed on Oct. 21, 2019, and which is incorporated herein in its entirety by reference.

FIELD

The present disclosure relates to the manufacture of devices using lithographic techniques. Specifically, the present disclosure relates to the sensing and analysis of alignment marks on substrates to characterize and control semiconductor photolithographic processes.

BACKGROUND

A lithographic apparatus can be used, for example, in the manufacture of integrated circuits (ICs). For that application, a patterning device, which is alternatively referred to as a mask or a reticle, may be used to generate a circuit pattern to be formed on an individual layer of the IC. This pattern can be transferred onto a target portion (e.g., comprising part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned.

Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning" direction) while synchronously scanning the substrate parallel or anti-parallel to this direction. It is also possible to transfer the pattern from the patterning device to the substrate by imprinting the pattern onto the substrate.

ICs are built up layer by layer, and modern ICs can have 30 or more layers. On Product Overlay (OPO) is a measure of a system's ability to print these layers accurately on top of each other. Successive layers or multiple processes on the same layer must be accurately aligned to the previous layer. Otherwise, electrical contact between structures will be poor and the resulting devices will not perform to specification. Good overlay improves device yield and enables smaller product patterns to be printed. The overlay error between successive layers formed in or on the patterned substrate is controlled by various parts of the exposure apparatus of the lithographic apparatus.

Process-induced wafer errors are a significant impediment to OPO performance Process-induced wafer errors are attributable to the complexity of printed patterns as well as an increase of the number of printed layers. This error is of relatively high spatial variation that is different from wafer to wafer, and within a given wafer.

In order to control the lithographic process to place device features accurately on the substrate, one or more alignment marks are generally provided on, for example, the substrate, and the lithographic apparatus includes one or more alignment sensors by which the position of the mark may be measured accurately. The alignment sensor may be effectively a position measuring apparatus. Different types of marks and different types of alignment sensors are known from different times and different manufacturers. Measurement of the relative position of several alignment marks within the field can correct for process-induced wafer errors. Alignment error variation within the field can be used to fit a model to correct for OPO within the field Lithographic apparatus are known to use multiple alignment systems to align the substrate with respect to the lithographic apparatus. The data can for example be obtained with any type of alignment sensor, for example a SMASH (SMart Alignment Sensor Hybrid) sensor, as described in U.S. Pat. No. 6,961,116, issued Nov. 1, 2005 and titled "Lithographic Apparatus, Device Manufacturing Method, and Device Manufactured Thereby," which is hereby incorporated by reference herein in its entirety, that employs a self-referencing interferometer with a single detector and four different wavelengths, and extracts the alignment signal in software, or ATHENA (Advanced Technology using High order ENhancement of Alignment), as described in U.S. Pat. No. 6,297,876, issued Oct. 2, 2001 and titled "Lithographic Projection Apparatus with an Alignment System for Aligning Substrate on Mask," which is hereby incorporated by reference in its entirety, which directs each of seven diffraction orders to a dedicated detector, or the ORION sensor which uses multiple polarizations per available signal (color).

Reference is made in particular to the European application No. EP 1 372 040 A1, granted Mar. 5, 2008 and titled "Lithographic Apparatus and Device Manufacturing Method" which document is hereby incorporated by reference in its entirety. EP 1 372 040 A1 describes an alignment system using a self-referencing interferometer that produces two overlapping images of an alignment marker. These two images are rotated over 180° with respect to each other. EP 1 372 040 A1 further describes the detection of the intensity variation of the interfering Fourier transforms of these two images in a pupil plane. These intensity variations correspond to a phase difference between different diffraction orders of the two images, and from this phase difference positional information is derived, which is required for the alignment process. Reference is also made to U.S. Pat. No. 8,610,898, "Self-Referencing Interferometer, Alignment System, and Lithographic Apparatus" issued Dec. 17, 2013, the entire contents of which are hereby incorporated by reference in their entirety.

Existing alignment systems and techniques can yield imperfect measurements due to an inability to differentiate between signal originating from the alignment mark and stray input from the substrate, referred to as product crosstalk. In other words, existing sensor systems typically have a single detector which collects all the light and does not know which signal is aberrant light from the products and which signal is coming from the alignment mark.

It is also desirable to have a system that measures smaller alignment marks. Typical dimensions for a conventional alignment mark may be, for example, 38 um by 80 um. Real estate on the wafer, however, is valuable and it would be beneficial to be able to use smaller alignment marks so that more of the wafer can be turned over to product. The use of smaller alignment marks also permits the use of a greater number of marks which enables correction of intrafield alignment errors.

SUMMARY

The following presents a simplified summary of one or more embodiments in order to provide a basic understanding of the embodiments. This summary is not an extensive overview of all contemplated embodiments, and is not intended to identify key or critical elements of all embodiments nor delineate the scope of any or all embodiments. Its sole purpose is to present some concepts of one or more embodiments in a simplified form as a prelude to the more detailed description that is presented later.

In accordance to one aspect of an embodiment, a system comprising a combination of detector types is used to obtain more complete knowledge of the state of the alignment mark. The signal from the alignment mark is split so that part of the signal reaches a detector and another part of the signal reaches a camera. Thus, part of the system (e.g., a single pixel detector) in effect "feels" the mark while another part of the system (the camera) in effect "sees" the mark. The data from these two parts enables identifying and discarding spurious signals from the substrate.

According to one aspect of an embodiment there is disclosed an apparatus for sensing an alignment pattern, the apparatus comprising a sensor arranged to receive light diffracted by the alignment pattern and adapted to generate an output comprising at least one standing output image of the alignment pattern as the alignment pattern is scanned, a detector adapted to detect a phase signal in the output, a camera adapted to capture an image of the output, an optical device arranged to receive the output and adapted to convey the output to the detector and the camera. The optical device may be adapted to convey the output to the detector and the camera simultaneously. The optical device may comprise a beam splitter. The optical device is adapted to convey the output to the detector and the camera alternately. The optical device may comprise a flip mirror. The sensor may comprise a self-referencing interferometer. The apparatus may further comprise a source of spatially coherent radiation arranged to illuminate the alignment pattern, the alignment pattern diffracting the spatially coherent radiation to produce the light diffracted by the alignment pattern. The apparatus may further comprise a processor arranged to receive data from the camera and adapted to perform image manipulation on the data. The image manipulation may include setting a digital aperture. The digital aperture may be of an arbitrary shape, and or apodized. The sensor may output a first standing output image of the alignment pattern and a second standing output image of the alignment pattern, and the image manipulation may include summing the first standing image and the second standing image. The sensor may output a first standing output image of the alignment pattern and a second standing output image of the alignment pattern, and the image manipulation may include taking a difference between the first standing image and the second standing image. The sensor may output a first standing output image of the alignment pattern and a second standing output image of the alignment pattern, and the image manipulation may include summing the first standing image and the second standing image and taking a difference between the first standing image and the second standing image.

According to another aspect of an embodiment there is disclosed a method of sensing an alignment pattern, the method comprising the steps of sensing light diffracted by the alignment pattern and generating an output comprising at least one standing output image of the alignment pattern as the alignment pattern is scanned, splitting the output between a detector and a camera, detecting a phase signal in the output using the detector, and capturing an image of the output using the camera.

According to yet another aspect of an embodiment there is disclosed a method of sensing an alignment pattern, the method comprising the steps of sensing light diffracted by the alignment pattern and generating an output comprising at least one standing output image of the alignment pattern as the alignment pattern is scanned, directing the output to a detector, detecting a phase signal in the output using the detector, directing the output to a camera, and capturing an image of the output using the camera. The step of directing the output to a detector and the step of directing the output to a camera may be performed concurrently or alternately. The step of sensing light diffracted by the alignment pattern and generating an output comprising at least one standing output image of the alignment pattern as the alignment pattern is scanned may be performed by a self-referencing interferometer. The method may further comprise a step, concurrent with the step of sensing light diffracted by the alignment pattern and generating an output comprising at least one standing output image of the alignment pattern as the alignment pattern is scanned, of illuminating the alignment pattern with spatially coherent radiation. The method may further comprise a step of performing image manipulation on the image captured by the camera. The image manipulation may include setting a digital aperture. The digital aperture may be of an arbitrary shape, modulated, and/or apodized. The output may comprise a first standing output image of the alignment pattern and a second standing output image of the alignment pattern, and the image manipulation may include summing the first standing image and the second standing image. The output may comprise a first standing output image of the alignment pattern and a second standing output image of the alignment pattern, and the image manipulation may include taking a difference between the first standing image and the second standing image. The output may comprise a first standing output image of the alignment pattern and a second standing output image of the alignment pattern, and the image manipulation may include summing the first standing image and the second standing image and taking a difference between the first standing image and the second standing image.

According to yet another aspect of an embodiment there is disclosed an apparatus for aligning a substrate having an alignment mark, the apparatus comprising a sensor having a field of view at the substrate larger than the alignment mark arranged to receive light diffracted by the alignment mark and adapted to generate an output comprising at least one standing output image of the alignment mark as the alignment mark is scanned, a detector adapted to detect a phase signal in the output, a camera adapted to capture an image of the output, and an optical device arranged to receive the output and adapted to convey the output to the detector and the camera.

According to yet another aspect of an embodiment there is disclosed an apparatus for aligning a substrate having at least two alignment marks, the apparatus comprising a sensor having a field of view at the substrate large enough to encompass both of the at least two alignment marks and arranged to receive light diffracted by the alignment marks and adapted to generate an output comprising at least one standing output image of the alignment marks as the alignment marks are scanned, a detector adapted to detect a phase signal in the output, a camera adapted to capture an image of the output, and an optical device arranged to receive the output and adapted to convey the output to the detector and the camera.

According to yet another aspect of an embodiment there is disclosed an apparatus for aligning a substrate having an alignment mark, the apparatus comprising a sensor arranged to receive light diffracted by an edge the alignment mark and adapted to generate an output comprising at least one standing output image of the edge as the alignment mark is scanned, a detector adapted to detect a phase signal in the output, a camera adapted to capture an image of the output, and an optical device arranged to receive the output and adapted to convey the output to the detector and the camera.

According to yet another aspect of an embodiment there is disclosed a lithographic apparatus including an arrangement for sensing an alignment pattern, the arrangement comprising a sensor arranged to receive light diffracted by the alignment pattern and adapted to generate an output comprising at least one standing output image of the alignment pattern as the alignment pattern is scanned, a detector adapted to detect a phase signal in the output, a camera adapted to capture an image of the output, and an optical device arranged to receive the output and adapted to convey the output to the detector and the camera.

According to yet another aspect of an embodiment there is disclosed a lithographic apparatus including an arrangement for sensing an alignment mark on a substrate, the arrangement comprising a sensor having a field of view at the substrate larger than the alignment mark arranged to receive light diffracted by the alignment mark and adapted to generate an output comprising at least one standing output image of the alignment mark as the alignment mark is scanned, a detector adapted to detect a phase signal in the output, a camera adapted to capture an image of the output, and an optical device arranged to receive the output and adapted to convey the output to the detector and the camera.

According to yet another aspect of an embodiment there is disclosed a lithographic apparatus including an arrangement for aligning a substrate having at least two alignment marks, the arrangement comprising a sensor having a field of view at the substrate large enough to encompass both of the at least two alignment marks and arranged to receive light diffracted by the alignment marks and adapted to generate an output comprising at least one standing output image of the alignment marks as the alignment marks are scanned, a detector adapted to detect a phase signal in the output, a camera adapted to capture an image of the output, and an optical device arranged to receive the output and adapted to convey the output to the detector and the camera.

According to yet another aspect of an embodiment there is disclosed a lithographic apparatus including an arrangement for aligning a substrate having an alignment mark, the apparatus comprising a sensor arranged to receive light diffracted by an edge the alignment mark and adapted to generate an output comprising at least one standing output image of the edge as the alignment mark is scanned, a detector adapted to detect a phase signal in the output, a camera adapted to capture an image of the output, and an optical device arranged to receive the output and adapted to convey the output to the detector and the camera.

Further embodiments, features, and advantages of the present invention, as well as the structure and operation of the various embodiments are described in detail below with reference to accompanying drawings.

BRIEF DESCRIPTION OF THE DRAWING

The accompanying drawings, which are incorporated herein and form part of the specification, illustrate the methods and systems of embodiments of the invention by way of example, and not by way of limitation. Together with the detailed description, the drawings further serve to explain the principles of and to enable a person skilled in the relevant art(s) to make and use the methods and systems presented herein. In the drawings, like reference numbers indicate identical or functionally similar elements.

Further features and advantages of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art based on the teachings contained herein.

DETAILED DESCRIPTION

Various embodiments are now described with reference to the drawings, wherein like reference numerals are used to refer to like elements throughout. In the following description, for purposes of explanation, numerous specific details are set forth in order to promote a thorough understanding of one or more embodiments. It may be evident in some or all instances, however, that any embodiment described below can be practiced without adopting the specific design details described below. In other instances, well-known structures and devices are shown in block diagram form in order to facilitate description of one or more embodiments. The following presents a simplified summary of one or more embodiments in order to provide a basic understanding of the embodiments. This summary is not an extensive overview of all contemplated embodiments, and is not intended to identify key or critical elements of all embodiments nor delineate the scope of any or all embodiments.

Embodiments of the invention may be implemented in hardware, firmware, software, or any combination thereof. Embodiments of the invention may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include solid state memory, read only memory (ROM), random access memory (RAM), magnetic disk storage media, optical storage media, flash memory devices; electrical, optical, acoustical or other forms of propagated signals (e.g., carrier waves, infrared signals, digital signals, etc.), and others. Further, firmware, software, routines, and instructions may be described herein as performing certain actions. However, it should be appreciated that such descriptions are merely for convenience and that such actions in fact result from computing devices, processors, controllers, or other devices executing the firmware, software, routines, instructions, etc.

Figure 1:
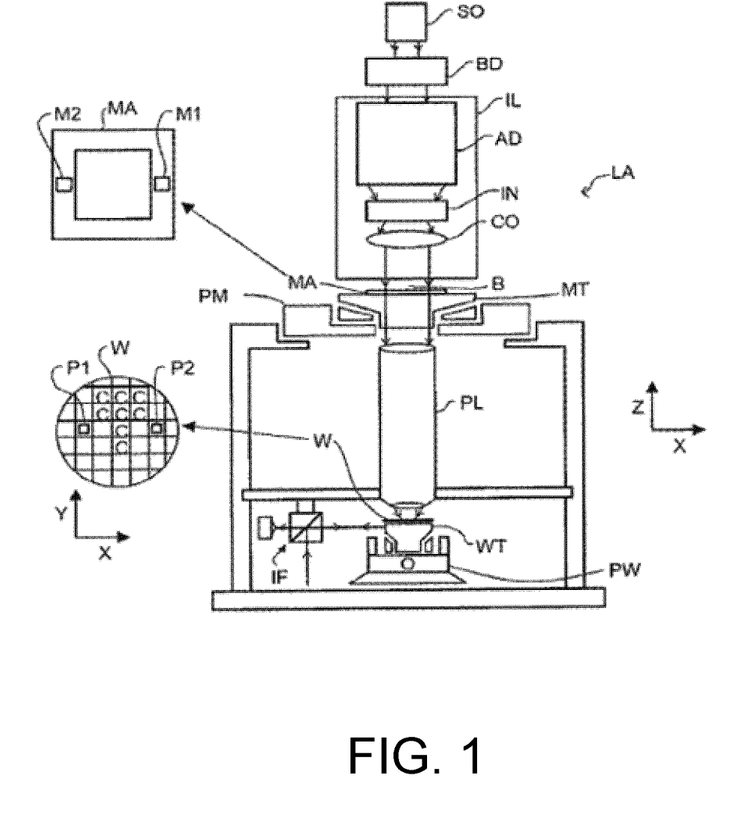
FIG. 1 depicts selected parts of a photolithography system such as could be used to according to aspects of an embodiment disclosed herein.

FIG. 1 schematically depicts a lithographic apparatus. The apparatus comprises an illumination system (illuminator) IL configured to condition a radiation beam B (e.g., UV radiation or other suitable radiation), a support structure (e.g., a mask table) MT constructed to support a patterning device (e.g., a mask) MA and connected to a first positioner PM configured to accurately position the patterning device in accordance with certain parameters, a substrate table (e.g., a wafer table) WT constructed to hold a substrate (e.g., a resist-coated wafer) W and connected to a second positioner PW configured to accurately position the substrate in accordance with certain parameters, and a projection system (e.g., a refractive projection lens system) PL configured to project a pattern imparted to the radiation beam B by patterning device MA onto a target portion C (e.g., comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure supports, i.e., bears the weight of, the patterning device. It holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam, which is reflected by the mirror matrix.

The term "projection system" used herein should be broadly interpreted as encompassing any type of projection system, including refractive, reflective, catadioptric, electromagnetic, and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g., employing a transmissive mask). Alternatively, the apparatus may be of a reflective type (e.g., employing a programmable mirror array or employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g., water, so as to fill a space between the projection system and the substrate. An immersion liquid may also be applied to other spaces in the lithographic apparatus, for example, between the mask and the projection system Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring again to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam B is incident on the patterning device (e.g., mask MA), which is held on the support structure (e.g., mask table MT), and is patterned by the patterning device. Having traversed the mask MA, the radiation beam B passes through the projection system PL, which focuses the beam onto a target portion C of the substrate W. With the aid of the second positioner PW and position sensor IF (e.g., an interferometric device, linear encoder, 2-D encoder or capacitive sensor), the substrate table WT can be moved accurately, e.g., so as to position different target portions C in the path of the radiation beam B. Similarly, the first positioner PM and another position sensor (which is not explicitly depicted in FIG. 1) can be used to accurately position the mask MA with respect to the path of the radiation beam B, e.g., after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies. The wafer may also include additional marks such as, for example, marks that are sensitive to variations in a chemical mechanical planarization (CMP) process used as a step in wafer fabrication.

The target P1 and/or P2 on substrate W may be, for example, (a) a resist layer grating, which is printed such that after development, the bars are formed of solid resist lines, or (b) a product layer grating, or (c) a composite grating stack in an overlay target structure comprising a resist grating overlaid or interleaved on a product layer grating. The bars may alternatively be etched into the substrate.

Figure 2:
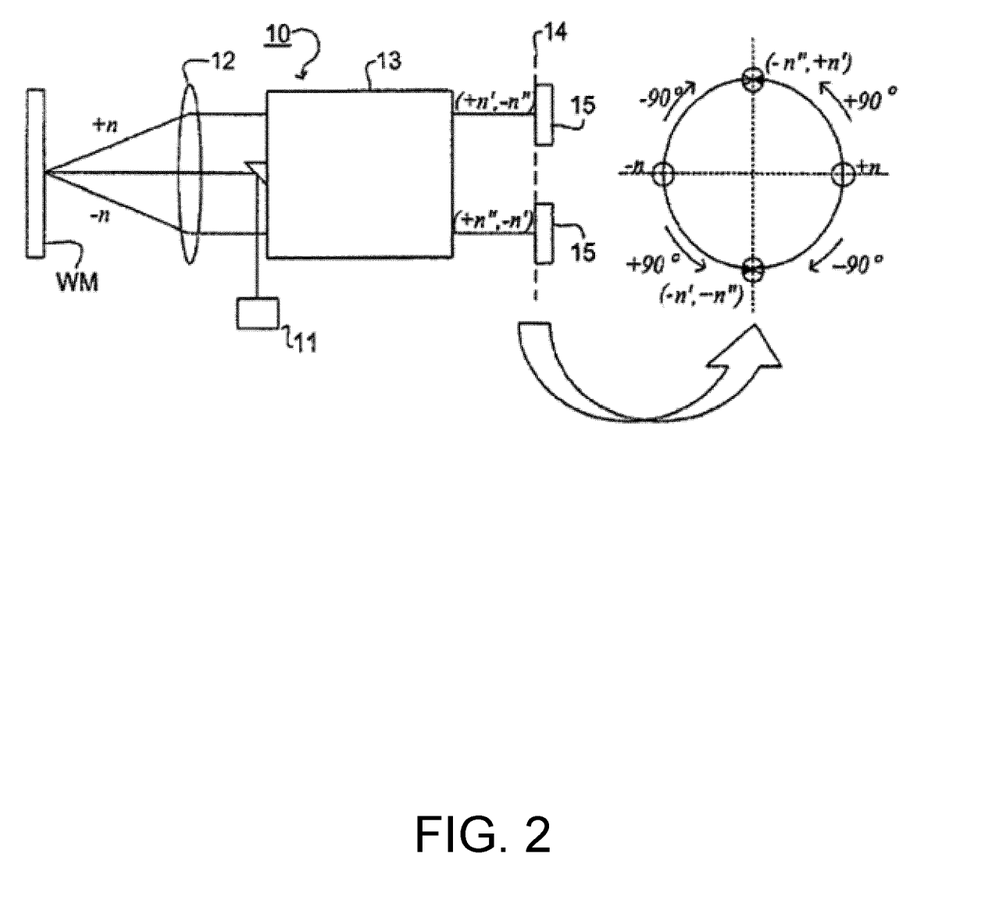
FIG. 2 depicts selected parts of a known alignment system for explaining the principles of its operation.

FIG. 2 shows a schematic overview of a known alignment system 10. A light source 11 emits a spatially coherent beam of radiation which illuminates an alignment marker WM on a substrate (e.g., a wafer) which reflects the radiation into positive and negative diffraction orders +n and −n. These diffraction orders are collimated by an objective lens 12 and enter a self-referencing interferometer (SRI) 13. The self-referencing interferometer outputs two images of the input with a relative rotation of 180° and which overlap and which can therefore be made to interfere. In a pupil plane 14, the overlapping Fourier transforms of these images, with the different diffraction orders separated can be seen and be made to interfere. Detectors 15 in the pupil plane detect the interfered diffraction orders to provide positional information. Based on this positional information a substrate can be aligned accurately with respect to a lithographic apparatus. The right-hand part of FIG. 2 shows the formation of two overlapping images in the pupil plane 14; for one image +n' and −n' are rotated by +90° relative to the input diffraction orders +n and −n; for the other image +n" and −n" are rotated by −90° relative to the input diffraction orders +n and −n. In the pupil plane the orders of respectively (+n' and −n"), and (+n" and −n') interfere.

The output of a sensor such as that just described is typically relayed to a detector that detects the pattern of intensities in the sensor output. In the alignment sensor the output sensor (a single pixel detector) detects the intensity variation arising from the interference between the + order and − order. This interference creates two channels, a SUM channel in which the electric fields are added and a DIFF channel in which the electric fields are subtracted. These two channels are 180 degrees out of phase with each other. The alignment position of the mark is computed by measuring the phase of the signal at the DIFF or SUM or a combination of the two channels.

In such systems all of the light is directed to the detector and the detector cannot differentiate between light coming from the mark and light from the wafer that is an artifact of wafer abnormalities. According to an aspect of an embodiment, optics are introduced to pick off a portion of the signal from the detector and direct it to a camera. The image on the camera is the image of the field at the wafer. In the case where the detector is an SRI, there will be two images which have been rotated 180 degrees with respect to each other. As used herein, the term "camera" means any device or system for capturing an image however configured.

Figure 3:
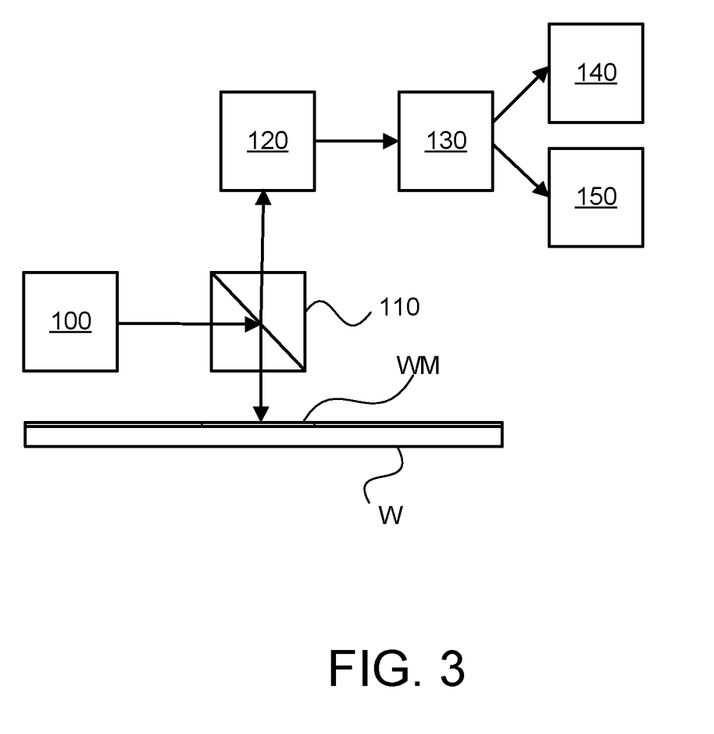
FIG. 3 depicts a system for analyzing alignment marks according to an aspect of an embodiment.

Such a system is shown in FIG. 3. As can be seen in the figure, a light source 100 produces a beam of spatially coherent radiation which passes through a beam splitter 110 and illuminates a wafer mark WM on a wafer W. Light from the wafer mark WM then passes through the beam splitter 110 to a sensor 120. The output of the sensor 120 is then divided by a beam splitter 130. A portion of the output of sensor 120 is passed to detector 140. The other part of the output of sensor 120 is passed to a camera 150.

Figure 4:
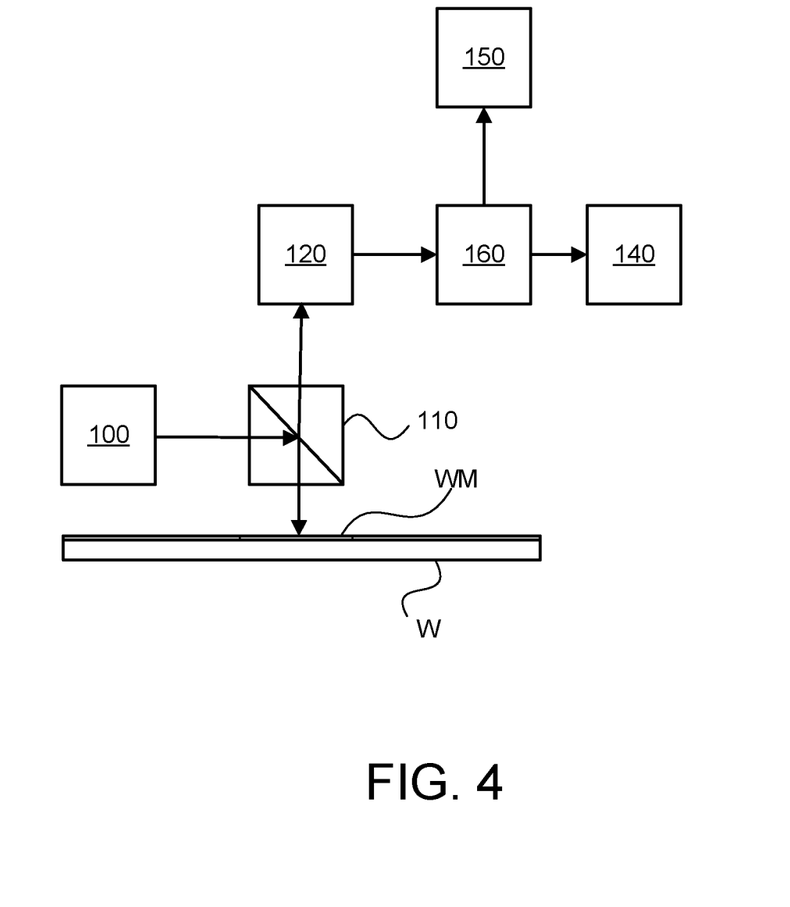
FIG. 4 depicts a system for analyzing alignment marks according to an aspect of an embodiment.

This arrangement of optical elements is not the sole possible arrangement. For example, as shown in FIG. 4, a flip mirror 160 can be used to alternately direct the output of sensor 120 to either the detector 140 or the camera 150. Thus, while the arrangement of FIG. 3 divides the sensor output spatially, the arrangement of FIG. 4 divides the sensor output temporally. For example, in FIG. 4 the flip mirror 160 may be used to direct the signal to the camera 150 when measuring only intrafield marks.

Figure 5A:
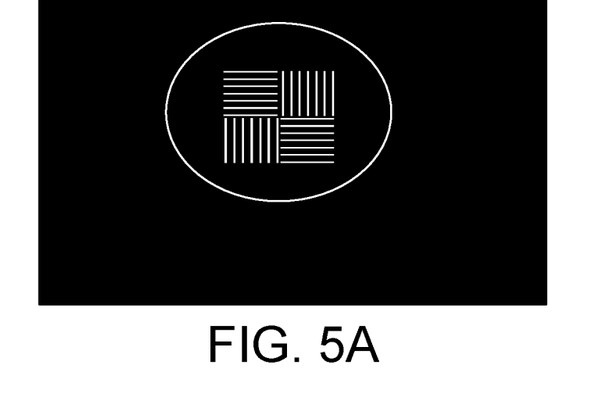
FIG. 5A shows a simulated alignment mark.
Figure 5B:
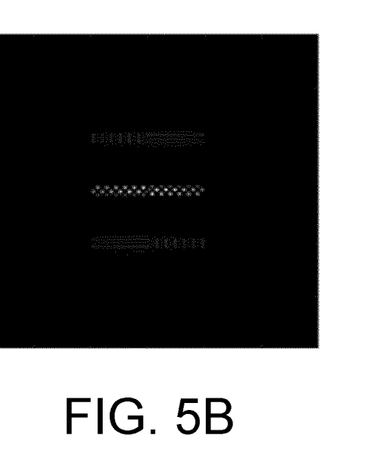
FIGS. 5B and 5C shows examples of simulated outputs of a system according to an aspect of an embodiment.
Figure 5C:
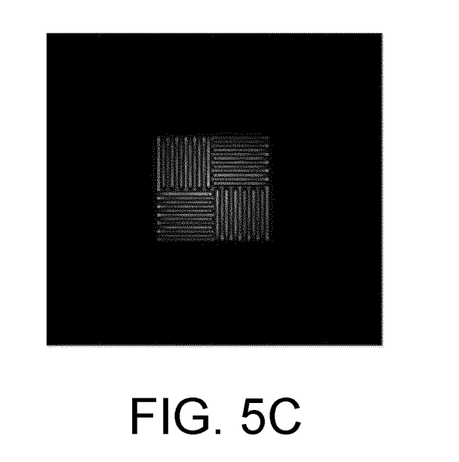

FIG. 5A shows a simulation of a micro-diffraction-based-overlay (μDBO or micro DBO) mark. FIG. 5B shows the results of taking the difference between the signals from the sensor (the diff channel, that is, the difference between the two images which have been rotated 180 degrees with respect to each other) and FIG. 5C shows the result of summing the signals (the sum channel) from the sensor. As the mark moves (in this case in the y direction), the standing images from the interferometer modulate in total intensity. The sum and diff channels can be combined electronically to always have good signal at the camera.

The mark may have a pitch that is so small that the signal from the diffraction from the mark pattern is beyond the numerical aperture of the objective lens used to gather the light. However, diffraction from the edges of the mark can still be captured and will show then mark.

In capturing the image, all pixels that are identified as light from the product, that is, as product interference pixels, can be eliminated from use in the image processing for alignments. This is in effect an actively addressable aperture, or digital aperture. It is possible to electronically modulate, e.g., apodize this aperture to make sensing more robust against inclination or defocus of the mark, or both.

Figure 6:
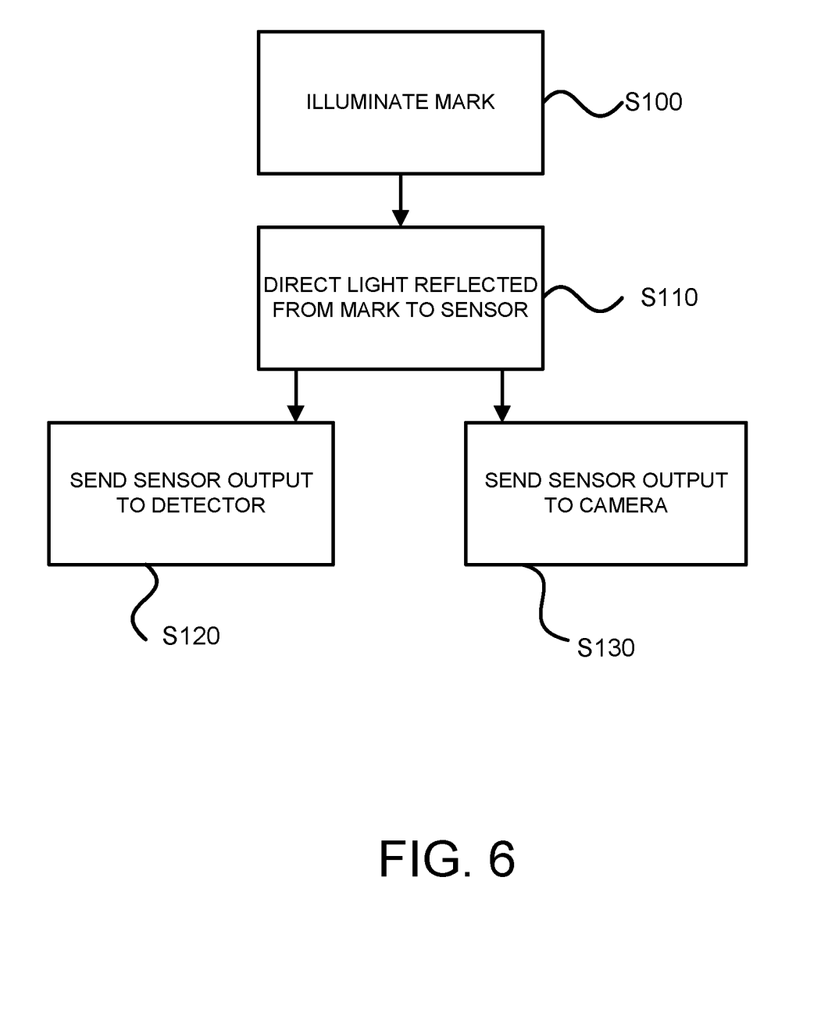
FIG. 6 is a flowchart showing a method of analyzing alignment marks according to an aspect of an embodiment.

According to another aspect of an embodiment, a method for analyzing an alignment mark may be carried out in accordance with the flowchart shown in FIG. 6. As shown in FIG. 6, in a step S100, the mark is illuminated. In a step S110, light reflected from the mark is directed to a sensor. Here the term "reflected" is used to include light that is diffracted by the mark. Then this light is sent to a detector in step S120 and/or to a camera in step S130. Steps 120 and S130 can be carried out simultaneously or alternately, as described above.

The embodiments may further be described using the following clauses:

1. Apparatus for sensing an alignment pattern, the apparatus comprising:
    a sensor arranged to receive light diffracted by the alignment pattern and adapted to generate an output comprising at least one standing output image of the alignment pattern as the alignment pattern is scanned;
    a detector adapted to detect a phase signal in the output;
    a camera adapted to capture an image of the output; and
    an optical device arranged to receive the output and adapted to convey the output to the detector and the camera.

2. Apparatus of clause 1 wherein the optical device is adapted to convey the output to the detector and the camera simultaneously.
3. Apparatus of clause 2 wherein the optical device comprises a beam splitter.
4. Apparatus of clause 1 wherein the optical device is adapted to convey the output to the detector and the camera alternately.
5. Apparatus of clause 4 wherein the optical device comprises a flip mirror.
6. Apparatus of any one of clauses 1-5 wherein the sensor comprises a self-referencing interferometer.
7. Apparatus of any one of clauses 1-6 further comprising a source of spatially coherent radiation arranged to illuminate the alignment pattern, the alignment pattern diffracting the spatially coherent radiation to produce the light diffracted by the alignment pattern.
8. Apparatus of clause 1 further comprising a processor arranged to receive data from the camera and adapted to perform image manipulation on the data.
9. Apparatus of clause 8 wherein the image manipulation includes setting a digital aperture.
10. Apparatus of clause 9 wherein the digital aperture is of an arbitrary shape.
11. Apparatus of clause 9 wherein the digital aperture is modulated.
12. Apparatus of clause 9 wherein the digital aperture is apodized.
13. Apparatus of clause 8 wherein the sensor outputs a first standing output image of the alignment pattern and a second standing output image of the alignment pattern, and wherein the image manipulation includes summing the first standing image and the second standing image.
14. Apparatus of clause 8 wherein the sensor outputs a first standing output image of the alignment pattern and a second standing output image of the alignment pattern, and wherein the image manipulation includes taking a difference between the first standing image and the second standing image.
15. Apparatus of clause 8 wherein the sensor outputs a first standing output image of the alignment pattern and a second standing output image of the alignment pattern, and wherein the image manipulation includes summing the first standing image and the second standing image and taking a difference between the first standing image and the second standing image.
16. A method of sensing an alignment pattern, the method comprising the steps of:
  sensing light diffracted by the alignment pattern and generating an output comprising at least one standing output image of the alignment pattern as the alignment pattern is scanned;
  splitting the output between a detector and a camera;
  detecting a phase signal in the output using the detector; and
  capturing an image of the output using the camera.
17. A method of sensing an alignment pattern, the method comprising the steps of:
  sensing light diffracted by the alignment pattern and generating an output comprising at least one standing output image of the alignment pattern as the alignment pattern is scanned;
  directing the output to a detector;
  detecting a phase signal in the output using the detector;
  directing the output to a camera; and
  capturing an image of the output using the camera.
18. A method of clause 17 wherein the step of directing the output to a detector and the step of directing the output to a camera are performed concurrently.
19. A method of clause 17 wherein the step of directing the output to a detector and the step of directing the output to a camera are performed alternately.
20. A method of clause 17 wherein the step of sensing light diffracted by the alignment pattern and generating an output comprising at least one standing output image of the alignment pattern as the alignment pattern is scanned is performed by a self-referencing interferometer.
21. A method of clause 17 further comprising a step, concurrent with the step of sensing light diffracted by the alignment pattern and generating an output comprising at least one standing output image of the alignment pattern as the alignment pattern is scanned, of illuminating the alignment pattern with spatially coherent radiation.
22. A method of clause 17 further comprising a step of performing image manipulation on the image captured by the camera.
23. A method of clause 22 wherein the image manipulation includes setting a digital aperture.
24. A method of clause 22 wherein the digital aperture is of an arbitrary shape.
25. A method of clause 22 wherein the digital aperture is modulated.
26. A method of clause 22 wherein the digital aperture is apodized.
27. A method of clause 21 wherein the output comprises a first standing output image of the alignment pattern and a second standing output image of the alignment pattern, and wherein the image manipulation includes summing the first standing image and the second standing image.
28. A method of clause 21 wherein the output comprises a first standing output image of the alignment pattern and a second standing output image of the alignment pattern, and wherein the image manipulation includes taking a difference between the first standing image and the second standing image.
29. A method of clause 21 wherein the output comprises a first standing output image of the alignment pattern and a second standing output image of the alignment pattern, and wherein the image manipulation includes summing the first standing image and the second standing image and taking a difference between the first standing image and the second standing image.
30. Apparatus for aligning a substrate having an alignment mark, the apparatus comprising:
  a sensor having a field of view at the substrate larger than the alignment mark arranged to receive light diffracted by the alignment mark and adapted to generate an output comprising at least one standing output image of the alignment mark as the alignment mark is scanned;
  a detector adapted to detect a phase signal in the output;
  a camera adapted to capture an image of the output; and
  an optical device arranged to receive the output and adapted to convey the output to the detector and the camera.
31. Apparatus for aligning a substrate having at least two alignment marks, the apparatus comprising:
  a sensor having a field of view at the substrate large enough to encompass both of the at least two alignment marks and arranged to receive light diffracted by the alignment marks and adapted to generate an output comprising at least one standing output image of the alignment marks as the alignment marks are scanned;

a detector adapted to detect a phase signal in the output;

a camera adapted to capture an image of the output; and an optical device arranged to receive the output and adapted to convey the output to the detector and the camera.

32. Apparatus for aligning a substrate having an alignment mark, the apparatus comprising:

a sensor arranged to receive light diffracted by an edge the alignment mark and adapted to generate an output comprising at least one standing output image of the edge as the alignment mark is scanned;

a detector adapted to detect a phase signal in the output;

a camera adapted to capture an image of the output; and an optical device arranged to receive the output and adapted to convey the output to the detector and the camera.

33. A lithographic apparatus including an arrangement for sensing an alignment pattern, the arrangement comprising:

a sensor arranged to receive light diffracted by the alignment pattern and adapted to generate an output comprising at least one standing output image of the alignment pattern as the alignment pattern is scanned;

a detector adapted to detect a phase signal in the output;

a camera adapted to capture an image of the output; and an optical device arranged to receive the output and adapted to convey the output to the detector and the camera.

34. A lithographic apparatus including an arrangement for sensing an alignment mark on a substrate, the arrangement comprising:

a sensor having a field of view at the substrate larger than the alignment mark arranged to receive light diffracted by the alignment mark and adapted to generate an output comprising at least one standing output image of the alignment mark as the alignment mark is scanned;

a detector adapted to detect a phase signal in the output;

a camera adapted to capture an image of the output; and an optical device arranged to receive the output and adapted to convey the output to the detector and the camera.

35. A lithographic apparatus including an arrangement for aligning a substrate having at least two alignment marks, the arrangement comprising:

a sensor having a field of view at the substrate large enough to encompass both of the at least two alignment marks and arranged to receive light diffracted by the alignment marks and adapted to generate an output comprising at least one standing output image of the alignment marks as the alignment marks are scanned;

a detector adapted to detect a phase signal in the output;

a camera adapted to capture an image of the output; and an optical device arranged to receive the output and adapted to convey the output to the detector and the camera.

36. A lithographic apparatus including an arrangement for aligning a substrate having an alignment mark, the apparatus comprising:

a sensor arranged to receive light diffracted by an edge the alignment mark and adapted to generate an output comprising at least one standing output image of the edge as the alignment mark is scanned;

a detector adapted to detect a phase signal in the output;

a camera adapted to capture an image of the output; and an optical device arranged to receive the output and adapted to convey the output to the detector and the camera.

The systems and methods disclosed herein capture the image of the mark downstream of a self-referencing interferometric sensor and make it possible to combine information from that image with information from the phase signal measured by the detector. The standing image pattern output by the self-referencing sensor allows scanning of the mark while collecting the image as opposed to having to pause scanning to obtain an image. Combining the diff and sum channels can be used to ensure enough signal for the image. The ability to apply a digital aperture of arbitrary shape with or without modulation/apodization allows measurement of features smaller than 20 microns and helps in differentiating the signal from the mark from signal originating from the product as background, leakage, or crosstalk. The subject matter disclosed herein provides a method to check integrity of marks and can reduce overlay error due to damaged marks.

Systems arranged in accordance with aspects of embodiments as described herein enable the realization of several potential benefits. For example, they confer the ability to ability to measure small marks that underfill the field of view at the wafer. They also confer the ability to measure multiple small marks within the field of view at the same time using the digital aperture and image manipulation techniques made available by aspects of embodiments. They also create or enhance the ability to align on the edge diffraction of the marks.

A system as described above can be used not just to improve overlay alignment but also to diagnose, monitor, and/or adjust scanner performance in general. The scan signal can be analyzed for correlations to key performance indicators for the stepper/scanner. The results of the analysis can be presented and/or stored in any several ways, for example, shown instantaneously on a monitoring device or compiled in a report.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g., having a wavelength of or about 365, 355, 248, 193, 157 or 126 nm) and extreme ultra-violet (EUV) radiation (e.g., having a wavelength in the range of 5-20 nm), as well as particle beams, such as ion beams or electron beams.

Although specific reference may be made in this text to the use of the apparatus according to the invention in the manufacture of ICs, it should be explicitly understood that such an apparatus has many other possible applications. For example, it may be employed in the manufacture of integrated optical systems, guidance and detection patterns for magnetic domain memories, liquid-crystal display panels, thin-film magnetic heads, etc. One of ordinary skill in the art will appreciate that, in the context of such alternative applications, any use of the terms "reticle", "wafer" or "die" in this text should be considered as being replaced by the more general terms "mask", "substrate" and "target portion," respectively.

The present invention has been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

The invention claimed is:

1. An apparatus for sensing an alignment mark on a substrate, the apparatus comprising:
    a sensor comprising a self-referencing interferometer having a field of view at the substrate larger than the alignment mark and configured to receive light diffracted by the alignment mark and adapted to generate an output comprising at least one standing output image of the alignment mark as the alignment mark is scanned;
    a detector adapted to detect a phase signal in the output;
    a camera adapted to capture an image of the output;
    an optical device configured to receive the output and adapted to convey the output to the detector and the camera; and
    a processor configured to receive data from the camera and adapted to perform image manipulation on the data, wherein the image manipulation comprises setting a digital aperture that is one of an arbitrary shape, modulated, or apodized.

2. The apparatus of claim 1, wherein the optical device is adapted to convey the output to the detector and the camera simultaneously.

3. The apparatus of claim 2, wherein the optical device comprises a beam splitter.

4. The apparatus of claim 1, wherein the optical device is adapted to convey the output to the detector and the camera alternately.

5. The apparatus of claim 4, wherein the optical device comprises a flip mirror.

6. The apparatus of claim 1, further comprising a source of spatially coherent radiation configured to illuminate the alignment mark, the alignment mark diffracting the spatially coherent radiation to produce the light diffracted by the alignment mark.

7. The apparatus of claim 1, wherein the sensor outputs a first standing output image of the alignment mark and a second standing output image of the alignment mark, and wherein the image manipulation comprises summing the first standing image and the second standing image.

8. The apparatus of claim 1, wherein the sensor outputs a first standing output image of the alignment mark and a second standing output image of the alignment mark, and wherein the image manipulation comprises taking a difference between the first standing image and the second standing image.

9. The apparatus of claim 1, wherein the sensor outputs a first standing output image of the alignment mark and a second standing output image of the alignment mark, and wherein the image manipulation comprises summing the first standing image and the second standing image and taking a difference between the first standing image and the second standing image.

10. A method, implemented by a metrology apparatus, for sensing an alignment mark on a substrate, the method comprising:
    receiving, at a sensor comprising a self-referencing interferometer having a field of view at the substrate larger than the alignment mark, light diffracted by the alignment mark;
    generating an output comprising at least one standing output image of the alignment mark as the alignment mark is scanned;
    detecting, at a detector, a phase signal in the output;
    capturing, at a camera, an image of the output;
    receiving, at an optical device, the output;
    conveying the output to the detector and the camera;
    receiving, at a processor, data from the camera; and
    performing image manipulation on the data, the image manipulation comprising setting a digital aperture that is one of an arbitrary shape, modulated, or apodized.

11. The method of claim 10, further comprising conveying, using the optical device, the output to the detector and the camera simultaneously.

12. The method of claim 11, further comprising implementing the optical device with a beam splitter.

13. The method of claim 10, further comprising conveying, using the optical device, the output to the detector and the camera alternately.

14. The method of claim 13, further comprising implementing the optical device with a flip mirror.

15. The method of claim 10, further comprising:
using a source of spatially coherent radiation configured to illuminate the alignment mark, and
diffracting, using the alignment mark, the spatially coherent radiation to produce the light diffracted by the alignment mark.

16. The method of claim 10, further comprising:
outputting, using the sensor, a first standing output image of the alignment mark and a second standing output image of the alignment mark,
wherein the image manipulation comprises summing the first standing image and the second standing image.

17. The method of claim 10, further comprising:
outputting, using the sensor, a first standing output image of the alignment mark and a second standing output image of the alignment mark,
wherein the image manipulation comprises taking a difference between the first standing image and the second standing image.

18. The method of claim 10, further comprising:
outputting, using the sensor, a first standing output image of the alignment mark and a second standing output image of the alignment mark,
wherein the image manipulation comprises summing the first standing image and the second standing image and taking a difference between the first standing image and the second standing image.

\* \* \* \* \*